United States Patent
Singh et al.

(10) Patent No.: US 6,396,059 B1
(45) Date of Patent: May 28, 2002

(54) USING A CRYSTALLOGRAPHIC ETCHED SILICON SAMPLE TO MEASURE AND CONTROL THE ELECTRON BEAM WIDTH OF A SEM

(75) Inventors: Bhanwar Singh, Morgan Hill; Bryan K. Choo, Mountain View; Sanjay K. Yedur, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/612,807

(22) Filed: Jul. 10, 2000

(51) Int. Cl.$^7$ .................................................. H01J 37/26
(52) U.S. Cl. ....................................................... 250/310
(58) Field of Search ................................. 250/306, 307, 250/310, 311

(56) References Cited

U.S. PATENT DOCUMENTS

| | | | | |
|---|---|---|---|---|
| 4,086,491 A | * | 4/1978 | Vaughan | 250/397 |
| 4,675,528 A | * | 6/1987 | Langner et al. | 250/396 R |
| 5,008,536 A | * | 4/1991 | Isakozawa et al. | 250/307 |
| 5,783,366 A | | 7/1998 | Chen et al. | |
| 5,962,867 A | | 10/1999 | Liu | |
| 6,054,710 A | * | 4/2000 | Bruggeman | 250/307 |
| 6,087,659 A | * | 7/2000 | Adler et al. | 250/310 |
| 6,114,695 A | * | 9/2000 | Todokoro et al. | 250/310 |
| 6,166,380 A | * | 12/2000 | Kitagawa et al. | 250/307 |

* cited by examiner

Primary Examiner—Kiet T. Nguyen
(74) Attorney, Agent, or Firm—Eschweiler & Associates, LLC (57) ABSTRACT

A system and method is provided for measuring and determining the resolution of a SEM imaging system employing a crystallographic etched sample with a re-entrant cross-sectional profile. A re-entrant or negative profile is employed because the top-down view seen by the SEM is very sharp due to the fact the edge of the profile has zero width. Therefore, any apparent width seen in the signal is a function of the electron beam width alone. Scanning the beam across the profile provides a signal that moves from a first state to a second state. The time period or sloping portion of the signal from the first state to the second state provides a direct correlation to the electron beam width. Thus, scanning across the sample allows for a calculation of the electron beam width. By scanning across features of different orientations, the shape of the electron beam can be determined. Alternatively, by rotating the electron beam and scanning across the same feature, the shape of the electron beam can be determined. A system can utilize this information to adjust the resolution of the SEM or a display displaying the image.

29 Claims, 8 Drawing Sheets

Fig. 7

USING A CRYSTALLOGRAPHIC ETCHED SILICON SAMPLE TO MEASURE AND CONTROL THE ELECTRON BEAM WIDTH OF A SEM

FIELD OF THE INVENTION

The present invention relates generally to semiconductor processing and, more particularly, to a system and method for determining the resolution of an electron beam in a scanning electron microscope by measuring and/or imaging features, such as lines and spaces, having a re-entrant profile.

BACKGROUND OF THE INVENTION

In the semiconductor industry, there is a continuing trend toward higher device densities. To achieve these high densities there has been and continues to be efforts toward scaling down the device dimensions on semiconductor wafers (e.g., at submicron levels). In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, etc.) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist, Scanning Electron Microscopes (SEMs) often are employed to analyze and measure critical dimensions resulting from the lithographic process. Critical dimensions include the size of minimum features across the wafer such as linewidth, spacing, and contact dimensions. Although SEMs have been effective, they are limited by the resolution or shape of an electron beam employed in the imaging process. The electron beam shape becomes elliptical over time due to electronic degassing from the wafer or sample being employed. Degradation or widening of the beam width in the x and y direction influences adversely the resolution of the SEM device. The wider the beam the more difficult it is to image accurately smaller features. Essentially, a beam that is not circular will have feature reading with resolutions that differ when different portions of the beam cross the feature.

In certain fabrication processes, resist and/or etched features have cross-sectional profiles that are re-entrant. By "re-entrant profile," it is meant that the sidewalls of the feature taper inwardly at the bottom of the feature. For an elongated feature, such as a line or space, a re-entrant profile may result in an elongated trench (e.g., having a triangular cross section) positioned along the juncture of the feature and the substrate surface parallel to the substrate surface. Re-entrant profile features have images with better resolution because side edges of the features being measured do not interfere with the measurement.

There is an unmet need to have a system and/or method which is able to determine and control the resolution of a SEM to facilitate improved measuring and/or imaging of a feature, such as a line and/or space. There is also an unmet need to have a system and/or method which is able to determine and control the shape of an electron beam employed by a SEM.

SUMMARY OF THE INVENTION

The present invention relates to a system and method for measuring and determining the resolution of a SEM imaging system employing an etched sample with a re-entrant cross-sectional profile. A re-entrant or negative profile is employed because the top-down view seen by the SEM is very sharp due to the fact the edge of the profile has zero width. Therefore, any apparent beamwidth seen in the signal is a function of the electron beam width alone. Scanning the beam across the profile provides a signal that moves from a first state to a second state. The time period or sloping portion of the signal from the first state to the second state (hereinafter referred to as the intermediary state) provides a correlation to the electron beam width. Thus, scanning across the sample allows for a calculation of the electron beam width. By scanning across features having different orientations, the shape of the electron beam can be determined. Alternatively, by rotating the electron beam and scanning across the same feature, the shape of the electron beam can be determined. A system can utilize this information to adjust the roundness of the electron beam. Alternatively, the system can utilize this information to adjust the resolution of the SEM or a display displaying the image.

One aspect of the present invention relates to a method for determining the resolution of a measurement system employing an electron beam and a detector for detecting secondary emissions and generating a signal corresponding to the secondary emissions. The method comprises the steps of providing a wafer with at least one reentrant feature and performing a scan of the at least one re-entrant feature with the electron beam to provide a signal corresponding to an image of the re-entrant feature. The signal has a first state, an intermediary state and a second state. The intermediary state of the signal is the evaluated and a width of the electron beam is determined based on the evaluation.

Another aspect of the invention relates to a method for determining the shape of an electron beam in a SEM system. The method comprises the steps of scanning a first re-entrant feature to produce a first signal and scanning a second re-entrant feature producing a second signal. The second re-entrant feature has a different orientation than the first re-entrant feature. The shape of the electron beam is determined based on evaluation of the first and second signals.

Yet another aspect of the invention relates to a method for determining the shape of an electron beam in a SEM system. The method comprises the steps of scanning a re-entrant feature to produce a first signal, rotating one of the electron beam and the re-entrant feature an angular amount and scanning the re-entrant feature producing a second signal. The shape of the electron beam is determined based on evaluation of the first and second signals.

Another aspect of the present invention relates to a system for determining the resolution of a CD system. The system comprises a measurement system configured for emitting a scanning signal along a substrate having at least one re-entrant feature. The measurement system is configured to produce a first signal based on a first image of the at least one re-entrant feature and determine a width of the scanning signal based on a portion of the first signal.

Yet another aspect of the present invention relates to a system for determining the resolution of a CD system. An emitter directs a beam onto a substrate having at least one re-entrant feature. A movement system is provided that is adapted to move the electron beam across the at least one re-entrant feature. A detector detects interactions between the beam and the at least one re-entrant feature and/or substrate and provides a detector signal indicative of the at least one re-entrant feature. A controller determines a beam width based on the detector signal.

Yet another aspect of the present invention relates to a CD-SEM system primarily for measuring a cross-sectional dimension of a feature having a re-entrant profile relative to a substrate. A lens is provided for directing an electron beam to the surface of the substrate during a first scanning interval and a second scanning interval. A first outer circumferential portion of the electron beam scans across the surface of the substrate during the first scanning interval and a second outer circumferential portion of the electron beam scans across the surface of the substrate during the second scanning interval. A detector provides a signal based upon electrons received from the surface of the wafer. A processing system determines a first electron beam width based on detected electrons associated with the first scanning interval and a second electron beam width based on detected electrons associated with the second scanning interval. The processing system determines a shape of the electron beam based on an aggregation of the first and second electron beam widths.

Yet another aspect of the present invention relates to a system for determining the width of an electron beam. The system comprises means for directing an electron beam signal across a surface of a wafer having at least one re-entrant profile, means for measuring a secondary signal generated as a result of the electron beam signal, means for generating an image signal based on the secondary signal and means for determining a width of the electron beam based on the image signal.

To the accomplishment of the foregoing and related ends, the invention, then, comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The present invention provides a system and methodology to measure the electron beam width of a SEM using a feature having a re-entrant profile. The system is implemented, for example, as part of a critical dimension scanning electron microscope (CD-SEM). Although the present invention is described in reference to a CD-SEM system, it is to be appreciated that the system and methodology described below may be applied to substantially any measurement system which employs a beam to measure and/or image topographical features.

Figure 1A:
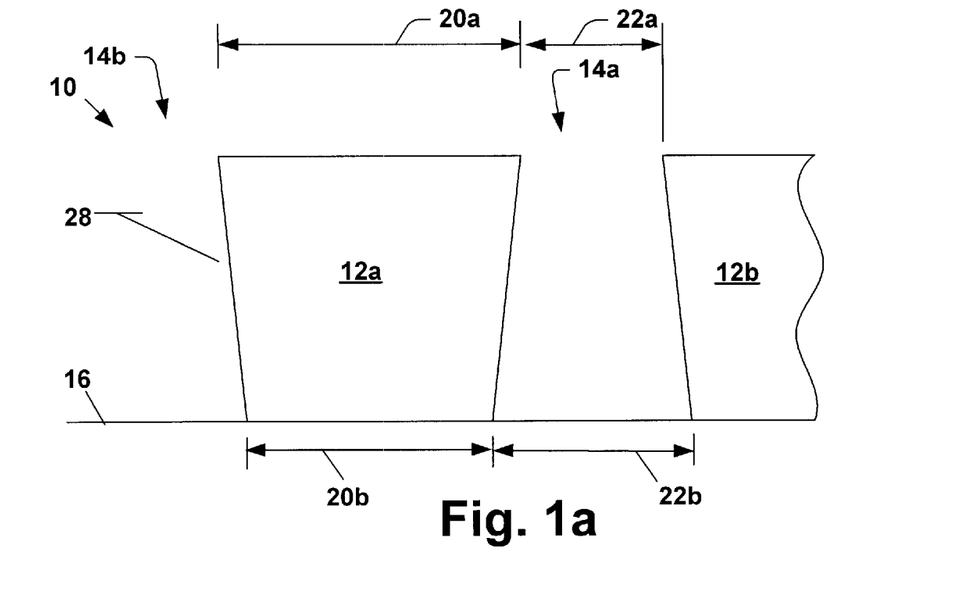
FIG. 1a is a cross-sectional view of a wafer having a re-entrant feature in accordance with the present invention.

FIG. 1a illustrates a cross-section of a printed wafer 10 having a plurality of features, including lines 12a and 12b and intermediate open regions or spaces 14a and 14b. The features have been patterned on or in an associated substrate to have reentrant profiles, in which sidewalls of the lines 12a and 12b taper inwardly at the bottom of the respective features. As such, corresponding critical dimensions of the features 12a and 12b near the substrate 16 differ from their corresponding critical dimensions distal the substrate. In particular, an upper linewidth dimension 20a of line 12a is greater than its lower linewidth dimension 20b (upper and lower being relative terms to describe feature dimensions illustrated according to FIG. 1a). Similarly, the adjacent space 14a has a cross-sectional shape, in which its upper critical dimension 22a is less than its lower critical dimension 22b.

Figure 1B:
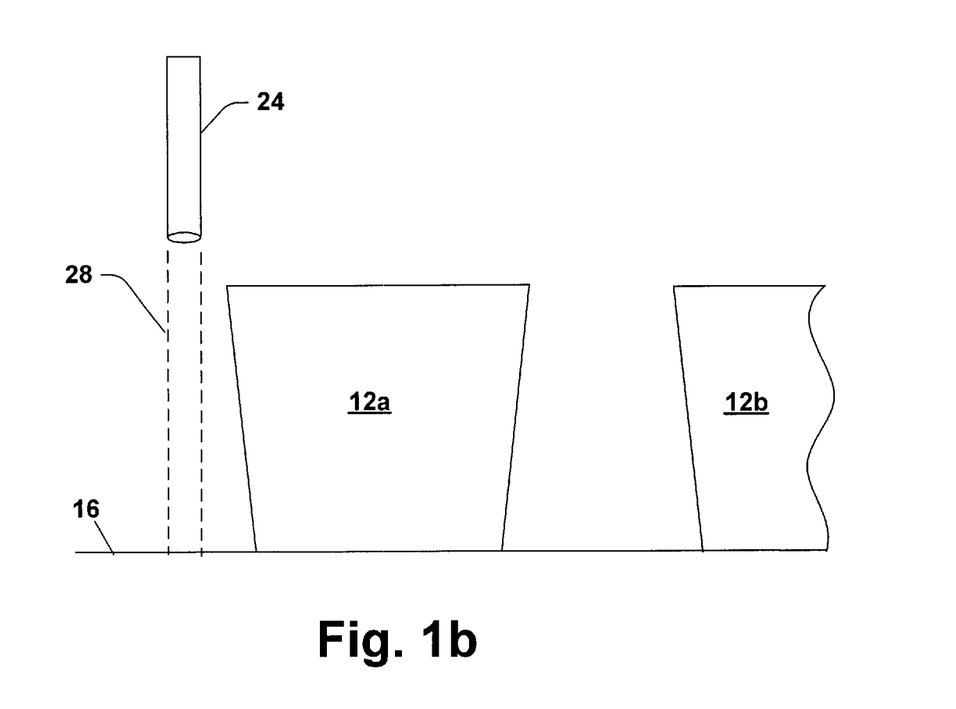
FIG. 1b is a cross-sectional view of the re-entrant feature of FIG. 1a undergoing a scan in a first state in accordance with the present invention.
Figure 1C:
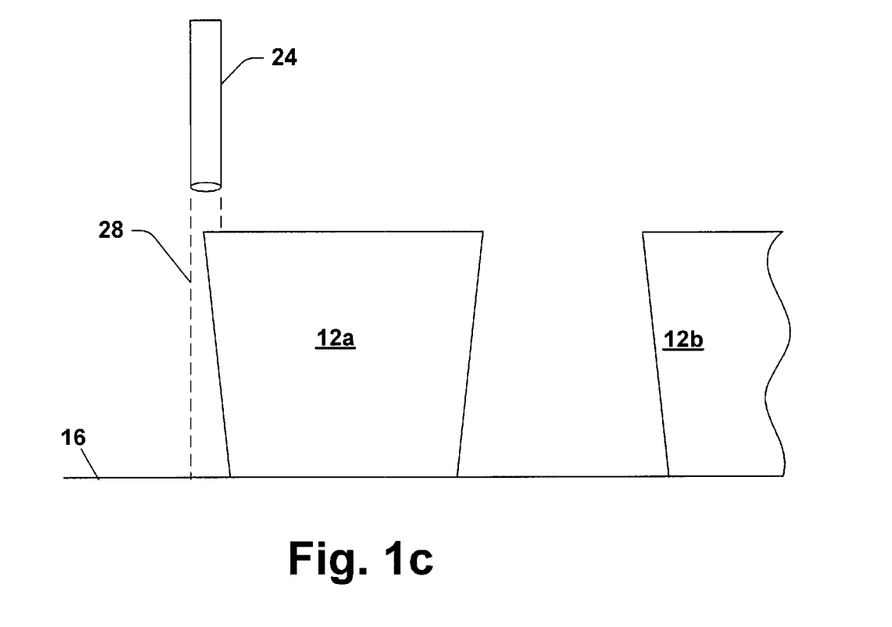
FIG. 1c is a cross-sectional view of the re-entrant feature of FIG. 1a undergoing a scan in an intermediary state in accordance with the present invention.
Figure 1D:
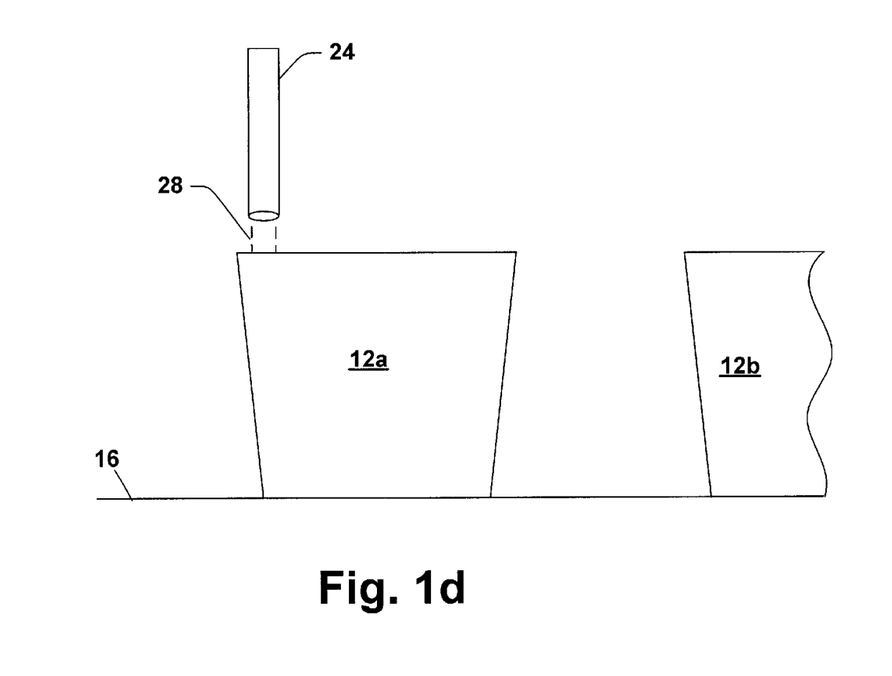
FIG. 1d is a cross-sectional view of the re-entrant feature of FIG. 1a undergoing a scan in an second state in accordance with the present invention.

FIGS. 1b–1d illustrate an approach for measuring critical dimensions of the wafer 10. An electron beam 28 is emitted by an electron beam emission element 24 as part of a SEM or like system. The electron beam 28 is emitted substantially perpendicular relative to the substrate 16 and traverses a path across the wafer. Because the electron beam 28 is provided in a top-down manner, the lower dimensions 20b and 22b are not measured and/or imaged, as they are shadowed by the upper portions of adjacent lines. The electron beam emission element 28 begins at a first state in open region 14b as illustrated in FIG. 1b. The electron beam emission element 28 then moves across the line 12a to an intermediate state partially above the open region 14b and partially above the line 12a as illustrated in FIG. 1c. The electron beam emission element 24 then moves to a second state completely over the line 12a, as illustrated in FIG. 1d. The electron beam 28 moves along with the electron beam emission element 24 and a secondary emission signal is generated from the substrate 16 to a detector (not shown), which produces a signal corresponding to the depth of the wafer features.

Figure 2A:
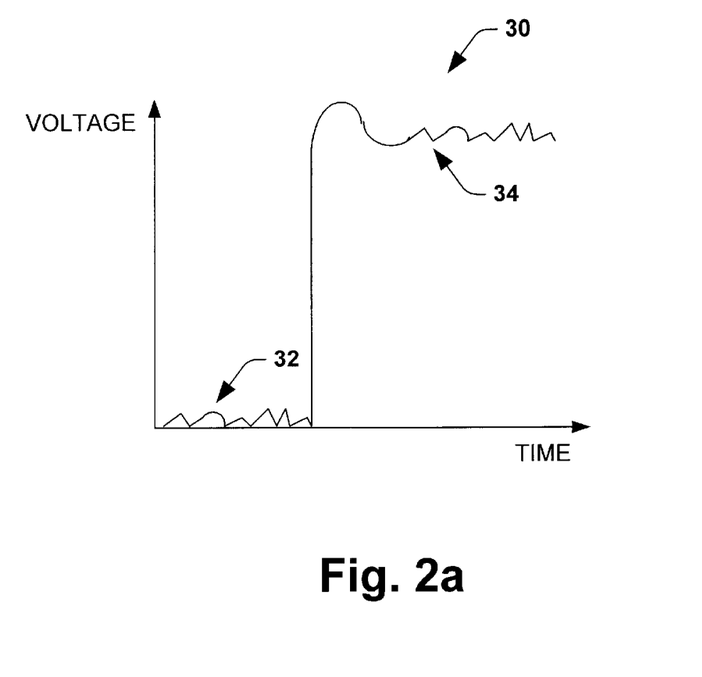
FIG. 2a is a diagram of an ideal signal of a scan of a re-entrant feature in accordance with the present invention.
Figure 2B:
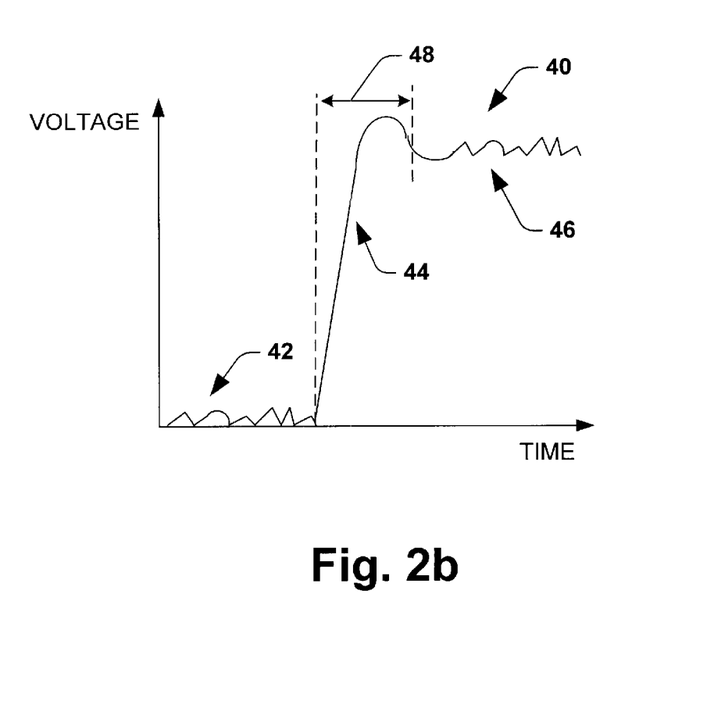
FIG. 2b is a diagram of an actual signal of a scan of a re-entrant feature in accordance with the present invention.

FIG. 2a illustrates an ideal signal 30 produced by the detector in response to a secondary emission of electron beam 28. The ideal signal is plotted along an X-Y axis with X being a time parameter and Y being a voltage parameter. The ideal signal has a first state 32 corresponding to the secondary emissions of electron beam 28 being generated from the open region 14b and a second state corresponding to the secondary electron emissions of electron beam being generated from the line 12a. An ideal signal does not have an intermediate state and would be achieved if the electron beam 28 had an infinitesimal width. FIG. 2b illustrates an actual signal 40 produced by the detector in response to secondary electron emissions of the electron beam 28. The actual signal is plotted along an X-Y axis with X being a time parameter and Y being a voltage parameter. The actual signal 40 has a first state 42 corresponding to secondary electron emissions of the electron beam 28 being generated from the open region 14b (see, e.g., FIG. 1b), an intermediate state 44 corresponding to secondary electron emissions of the electron beam 28 being generated partially from the open region 14b and partially from the line 12a (see, e.g., FIG. 1c), and a second state corresponding to secondary electron emissions of the electron beam 28 being generated from the line 12a only (see, e.g., FIG. 1d). A time measurement interval 48 associated with the actual signal 40 can be evaluated that corresponds to the electron beam width. The beam width measurement can be used to evaluate the resolution of the SEM system and further used to adjust the resolution or take the actual beam width into account to improve the resolution of the SEM system and/or a display which is imaging the feature.

It is to be appreciated that by scanning the electron beam across features having different orientations (e.g., features having a transverse axis with respect to one another) the shape of the electron beam can be determined. The shape of the electron beam can also be determined by scanning the electron beam across a single feature, and repeatedly rotating the electron beam emission element or the single feature and scanning across-the single feature until a desired number of measurements have been obtained. Although a beam with a beam width of zero is ideal, the next best possible situation is where a beam shape is circular, such that the beam width is the same scanned across features of any orientation. The beam width measurement can also be used to evaluate the shape of the electron beam of the SEM system and further used to adjust the roundness of the electron beam of the SEM system.

Figure 3A:
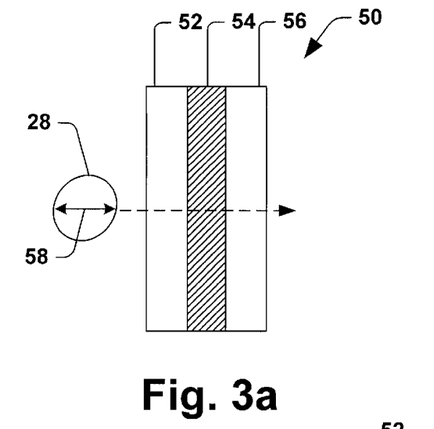
FIG. 3a is a top view of a wafer feature being scanned in accordance with the present invention.
Figure 3B:
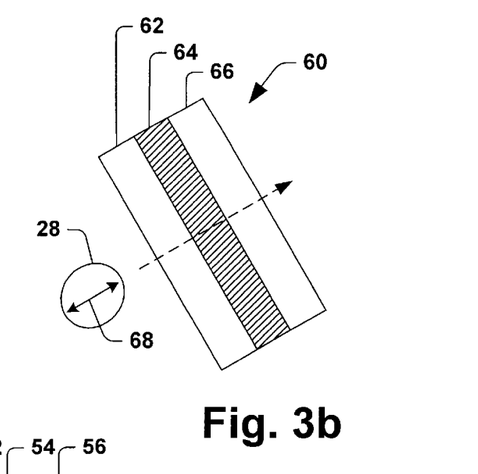
FIG. 3b is a top view of a wafer feature with a different orientation with respect to the feature of FIG. 3a being scanned in accordance with the present invention.

An exemplary methodology of determining the shape of the electron beam 28 is illustrated in FIGS. 3a–3b. Referring initially to FIG. 3a, the electron beam 28 is scanned across a feature 50 having a first opening 52, a line 54 and a second opening 56. A beam width 58 is then calculated by analyzing the resulting scanned signal as shown in FIG. 2b and stored for later use. FIG. 3b illustrates scanning the beam 28 across a feature 60 having a different orientation than the feature 50 of FIG. 3a. This feature 60 has a longitudinal axis that is transverse or nonparallel to the longitudinal axis of the feature 50 illustrated in FIG. 3a. The feature has a first opening 62, a first line 64 and a second opening 66. The electron beam 28 is scanned across the feature 60 and a beam width 68 is calculated using the resulting signal. The beam width 68 is transverse to the beam width 58 calculated in the feature 50. The beam 28 can be scanned across any number of features with different orientations to determine an overall general shape thereof.

Figure 3C:
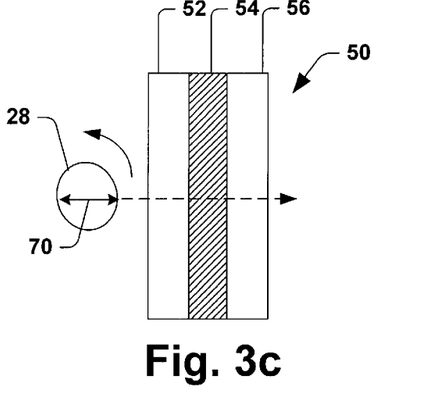
FIG. 3c is a top view of the wafer feature of FIG. 3a being scanned after the electron beam has been rotated in accordance with the present invention.
Figure 3D:
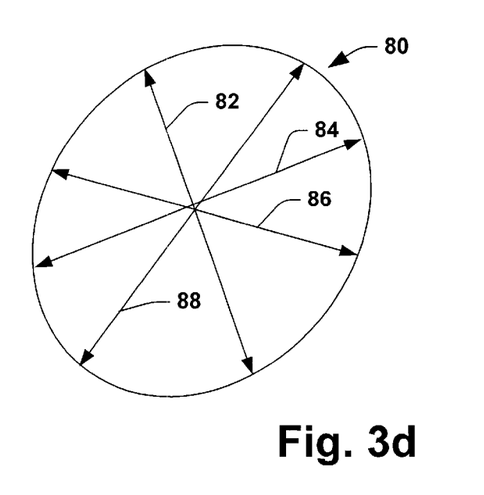
FIG. 3d is a top view of a constructed scanning electron beam using the measurements obtained by the scanning of FIGS. 3a and 3b or FIG. 3c.

An alternate methodology of determining the shape of the electron beam is illustrated with respect to FIG. 3a and FIG. 3c. The beam width calculation illustrated above with respect to FIG. 3a is repeated. A second beam width measurement can be obtained by rotating the electron beam emission element 24 or the feature 50 and scanning the electron beam 28 across the feature 50 as illustrated in FIG. 3c. A second beam width 70 across a different diameter region of the beam 28 can be calculated. The electron beam emission element 24 or the feature 50 can be rotated and scanned any number of times until a desired overall shape is determined. The beam shape can be used to evaluate the resolution of the SEM system and further used to adjust the resolution of the SEM system or the roundness of the electron beam. It is to be appreciated that the size of the features are irrelevant because the electron beam width is determined by the intermediate signal measurement as the electron beam passes from an opening to a line. FIG. 3d illustrates an exemplary shape 80 of the electron beam 28 determined by four different width measurements. The exemplary shape 80 includes a first width 82, a second width 84, a third width 86 and a fourth width 88.

Figure 4:
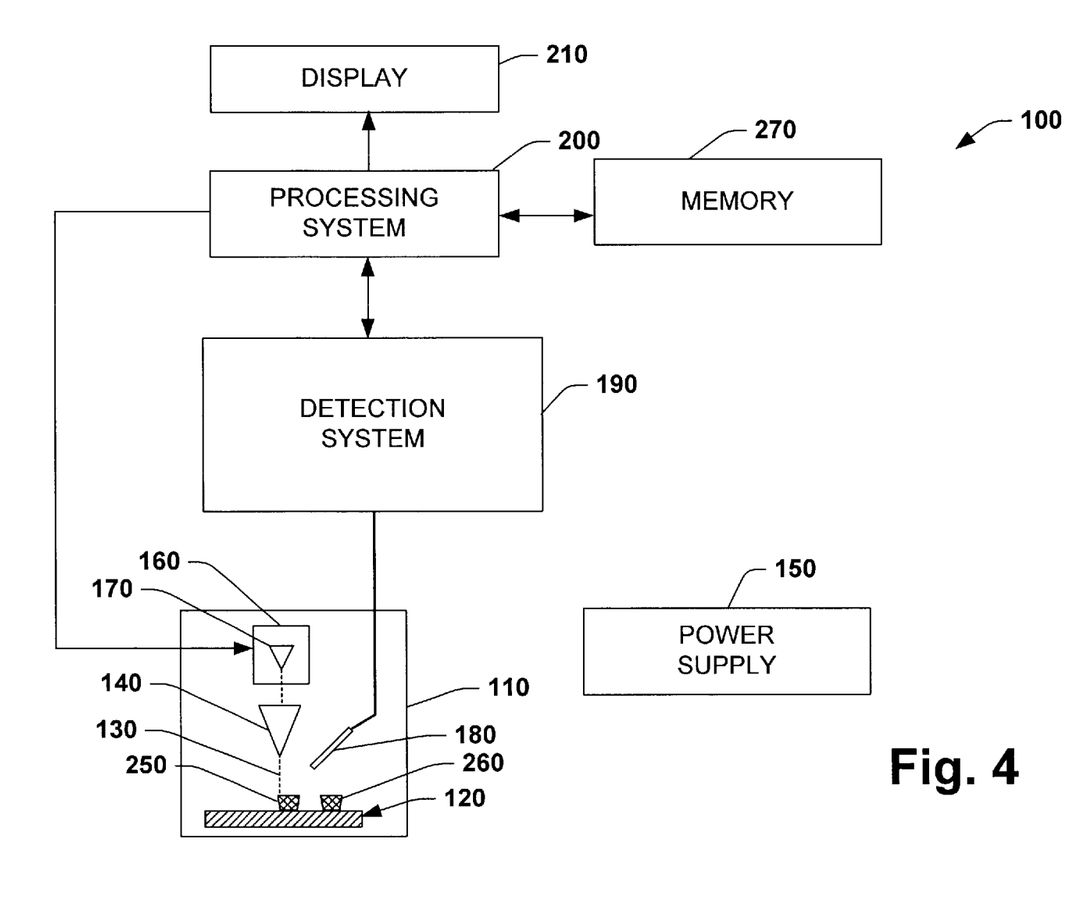
FIG. 4 is a system block diagram of a feature dimension measurement system in accordance with the present invention.

Referring to FIG. 4, a critical dimension electron microscope (CD-SEM) system 100 is shown for measuring and/or imaging feature profiles in accordance with the present invention. The system includes a chamber 110 for housing a wafer 120 with a pair of re-entrant features 260. It is to be appreciated that the re-entrant features may provided on a test wafer or may be provided as a sample profile mounted on a stage and use prior to calibration of the CD-SEM system 100. An electron beam 130 is directed from an electromagnetic lens 140 toward the wafer 120. The electron beam 130 is created from high voltage supplied by power supply 150 associated with a beam generating system 160 which includes an emission element 170. The power supply 150 provides operating power to the CD-SEM system 100 along with providing a high voltage to the beam generating system 160. Any suitable power supply (e.g., linear, switching) may be employed to carry out the present invention. Various focusing, and scanning elements (not shown) in the beam generating system 160 further guide the electron beam 130 from the emission element 170 to the electromagnetic lens 140. The emission 170 and the electromagnetic lens 140 are movable in any X and Y direction along the substrate. Additionally, the emission element 170 is rotable about its central longitudinal axis. In an alternate aspect of the invention, the chamber 100 is movable in any X and Y direction in addition to being rotatable about the central axis. This allows for scanning of features of different orientation. Futhermore, this allows for rotation of the electron beam 130 or for rotation of a feature for scanning of the same feature with different outer circumferential portions of the electron beam 130. The electron beam particles may be accelerated to energies ranging, for example, from about 500 eV to 40 Kev.

When the electron beam 130 strikes the surface of the wafer 120, electrons and X-rays are emitted which are detected by a detector 180 and are provided to a detection system 190. The detection system 190 provides digitized detector signals to a processing system 200 for performing conventional critical dimension measurements and signal analysis in accordance with the present invention. Electrons which are emitted from the surface of the wafer 120, which are most useful for critical dimension imaging, are known as secondary electrons or secondary emissions and provide a substantial amount of the signal current received by the detector 180. A critical dimension image may also be directed to an associated display 210 by the processing system 200. In addition to analyzing data received by the detection system 190, the processing system 200 synchronizes the scanning of the display 210 with electron beam 130 scanning of the wafer 120 to provide the image. A contrast of the displayed image is related to variations in the flux of electrons arriving at the detector 180, which varies based on the yield of emitted electrons from the surface of the wafer 120 relative to the incident electrons from the electron beam 130.

The processor system 200 also evaluates the beam width or the beam shape of the electron beam 130 by evaluating the intermediary beam signal for one or more measurements. The processor system also compensates the critical dimension image resolution based on the beam width or beam shape measurements, for example, by interpolation. Furthermore, the processor can adjust the image on the display 210 to ensure maximum resolution. Additionally, the processor can adjust the roundness of the beam based on the beam shape measurements. The latter adjustment can be performed by adjusting the optics of the SEM to focus the electron beam for roundness. For example, a feedback line from the processor system 200 to the lens system can be provided for adjusting the lens voltage and current to control the beam roundness.

The detection system 190 receives the signals indicative of electron emissions from the wafer surface via the detector 180 and digitizes the information for the processing system 200. In addition, the detection system 190 may also provide filtering or other signal processing of the received signal, as described in more detail below. The processing system 200 provides critical dimension information and to the display 210 and/or stores information in a memory 270. The processing system 200 includes a processor (not shown) for controlling the beam generating system 160, providing critical dimension measurements, and for performing signal analysis in accordance with the present invention. It is to be appreciated that a plurality of processors and/or processing systems may be included as part of and/or external to the CD-SEM system 200 for performing signal analysis in accordance with the present invention.

The processor in the processing system 200 also is programmed to control and operate the various components within the critical dimension scanning electron microscope system 100 in order to carry out the various functions described herein. The processor may be any of a plurality of processors, such as the AMD ATHLON™, K6™, K7™ or other type architecture processors. The manner in which the processor may be programmed to carry out the functions relating to the present invention will be readily apparent to those having ordinary skill in the art based on the description provided herein and are omitted herein for the sake of brevity.

The memory 270 is operatively coupled to the processing system 200 and serves to store program code executed by the processor for carrying out operating functions of the system 100 as described herein. The memory 270 also serves as a storage medium for temporarily storing information, such as curve fitting data, critical dimension data, beam width measurements, beam shapes, statistical data, and other data which may be employed in carrying out the present invention. The system 100 also may include additional memory (e.g., non-volatile memory) for storing measurement data and/or images for a wafer under test.

The signals received from scanning the wafer 120 surface are digitized and analyzed as a data set. Analysis of the data, such as, for example, by employing regression mathematics to the data set, produces a shape for the data set corresponding to the feature profile. In particular, each scanning interval produces an image portion corresponding to part of the feature profile, from which unreliable regions of the image (e.g., the side edges of the feature) may be rejected or ignored based on predetermined criteria for the shape of the data set.

Figure 5:
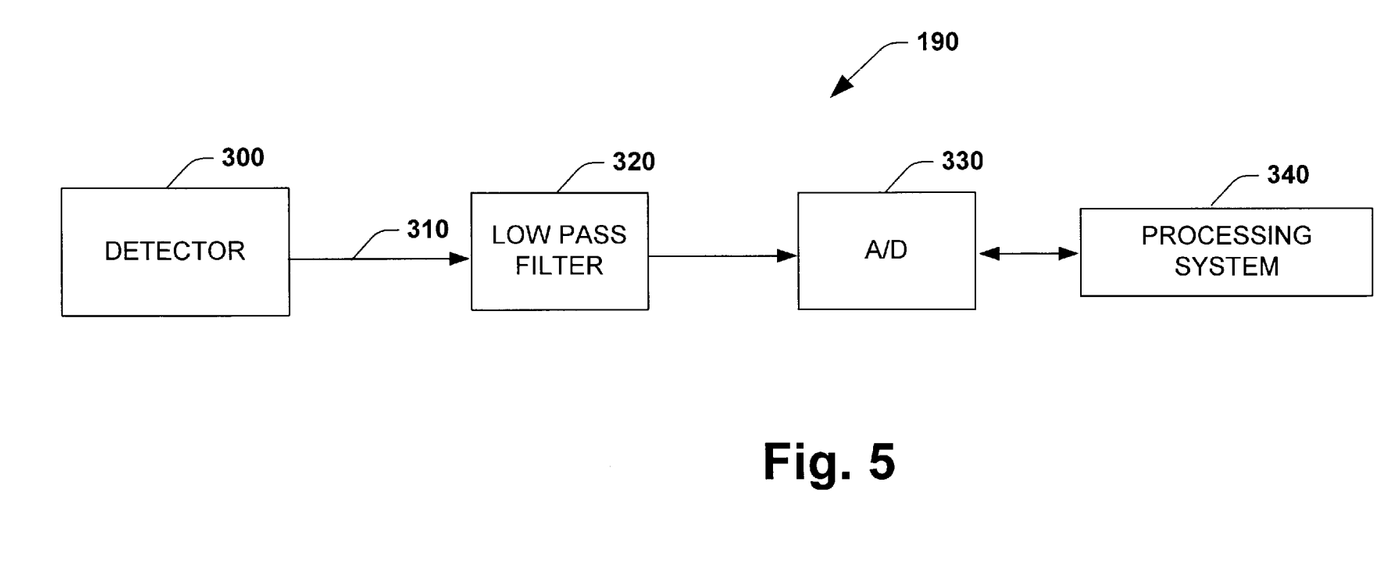
FIG. 5 is more detailed schematic block diagram of the detection system of FIG. 4 in accordance with the present invention.

Now referring to FIG. 5, a more detailed drawing of an exemplary detection system 190 of FIG. 4 is shown. A potentially noisy electrical output signal 310 from a detector 300 is coupled to the input of a low pass filter 320. The low pass filter 320 is shown for illustrative purposes and may be implemented in hardware or as part of a digital low pass filter algorithm in a processing system 340. The signal 310 may need to be smoothed by a low pass filter before subsequent shape analysis occurs by the present invention. An analog to digital (A/D) converter 330, receives the analog signal provided by the detector 300 and/or low pass filter 320 and converts the signal to digital form. The A/D converter 330 provides binary data to the processing system 340 which performs critical dimension measurements and performs signal analysis in accordance with the present invention. The binary data may be stored in memory for subsequent signal analysis or may be analyzed concurrently with the critical dimension measurement.

The present invention may be implemented as a software system operating in conjunction with a CD algorithm of the SEM system 400. It is to be appreciated however, that the present invention may be implemented as part of a separate processing system. For example, the critical dimension signal data may be passed to a post or concurrent processing system to determine the critical dimensions and the beam widths for a particular feature being measured. It is further to be appreciated that the present invention may be directed to other systems which provide signals based on surface geometry and/or topographical measurements.

A curve fitting analysis is applied to the received data to determine the signal shape (e.g., flat shape, parabolic shape) in the measured region. Many techniques are available for fitting particular data to a linear region or to a curve such as, for example, a linear and/or polynomial regression algorithm to determine the amount of flatness or curvature in the feature region. It is to be appreciated, however, that many other well known methods for curve fitting and/or regression may be applied to determine the shape of the received data and each such method is contemplated as falling within the scope of the present invention.

Figure 6:
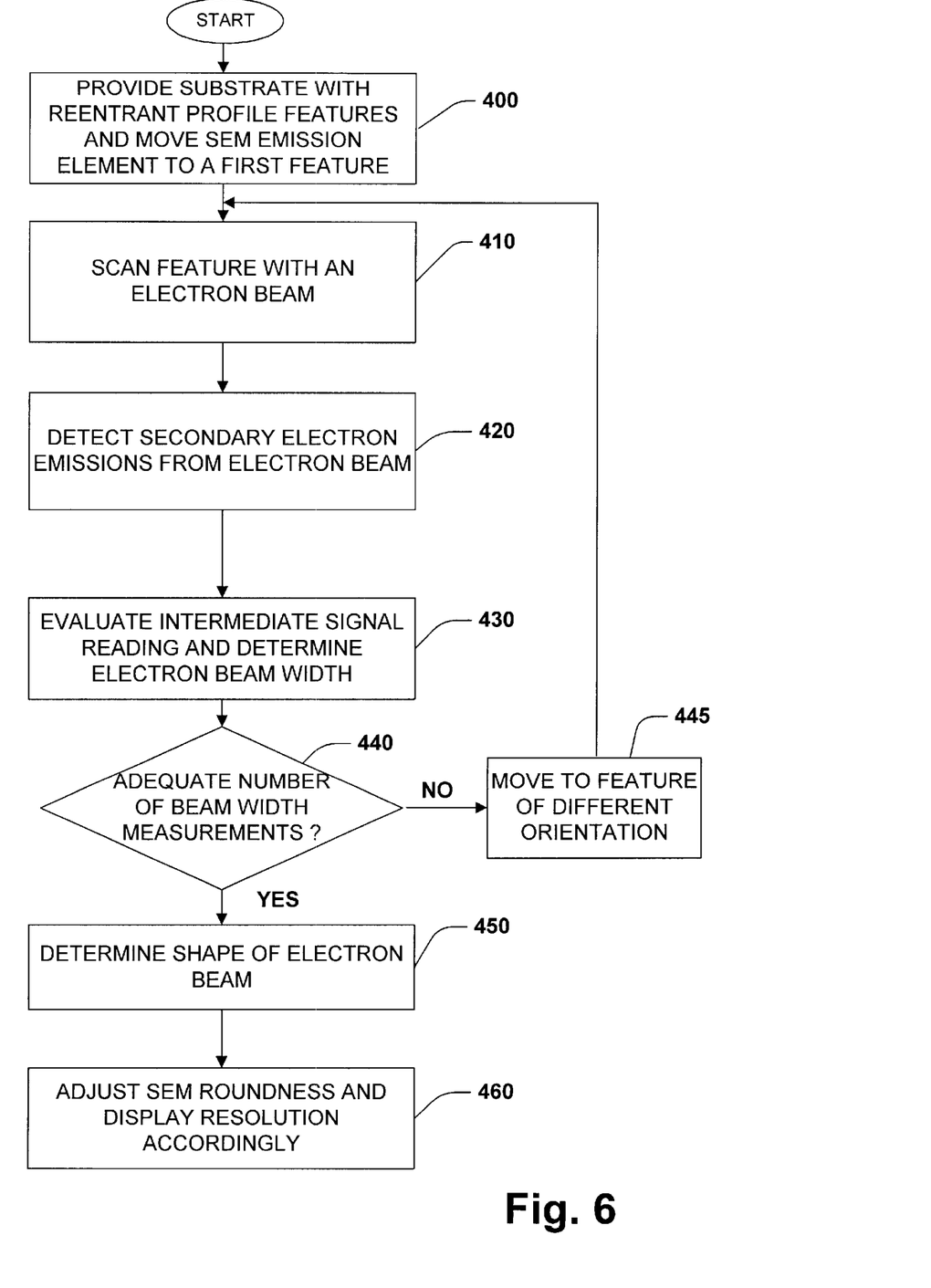
FIG. 6 is a flow chart diagram illustrating a methodology for determining an electron beam shape in accordance with the present invention.
Figure 7:
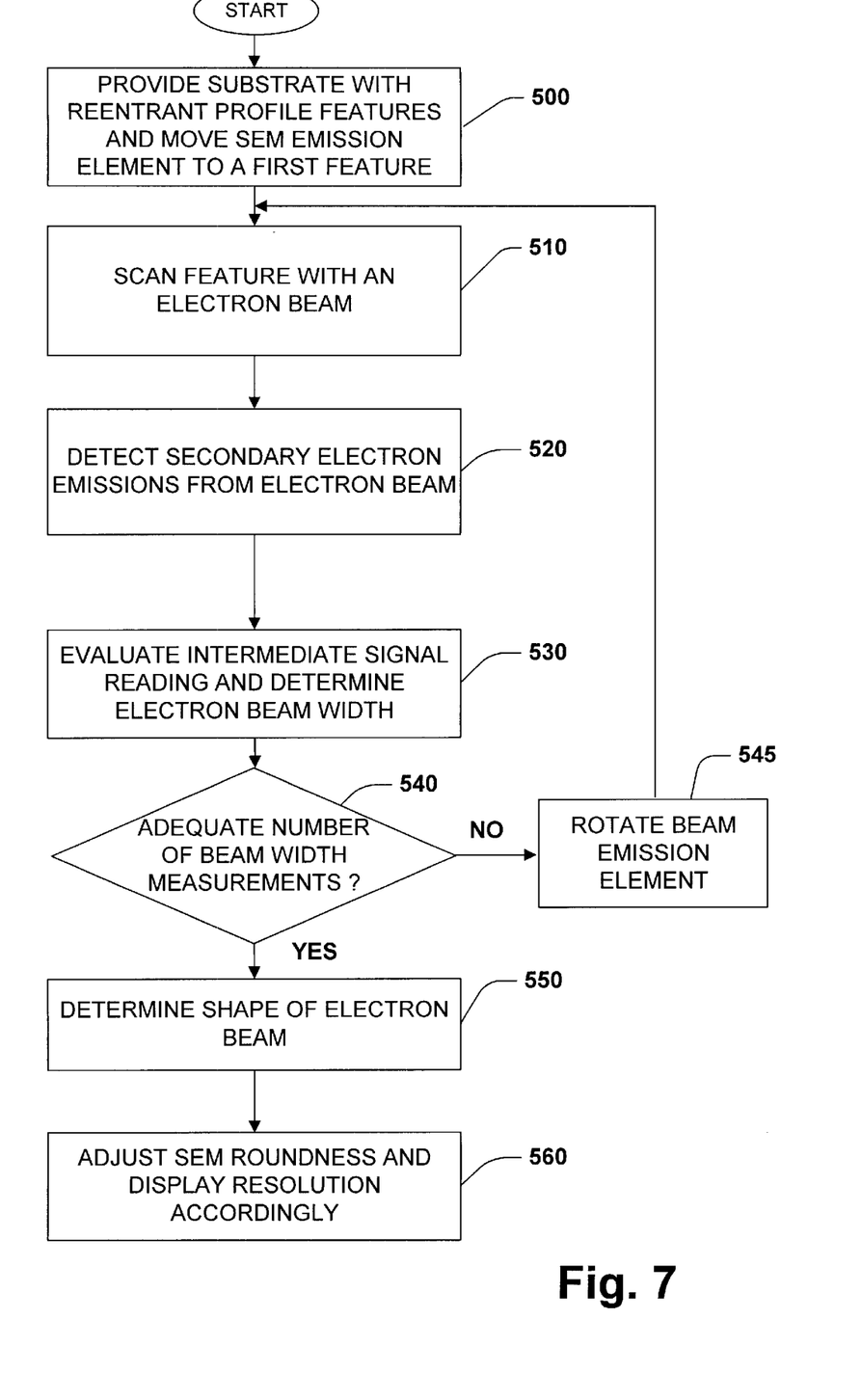
FIG. 7 is a flow chart diagram illustrating an alternate methodology for determining an electron beam shape in accordance with the present invention.

In view of the exemplary operating environments and scanning implementations shown and described above, a methodology, which may be implemented in accordance with the present invention, will be better appreciated with reference to the flow diagrams of FIG. 6 and FIG. 7. While, for purposes of simplicity of explanation, the methodology of FIG. 6 and FIG. 7 are shown and described as a series of steps, it is to be understood and appreciated that the present invention is not limited by the order of steps, as some steps may, in accordance with the present invention, occur in different orders and/or concurrently with other steps from that shown and described herein. Moreover, not all illustrated steps may be required to implement a methodology in accordance with the present invention.

Referring to FIG. 6, the process begins at step 400 in which a substrate, such as a wafer, with re-entrant profile features is positioned in a CD-SEM system for performing measurements and a SEM emission element is moved to a first feature thereof in accordance with the present invention. In addition, parameters are initialized and flag conditions are set to their starting values. The process then proceeds to step 410.

At step 410, the feature is scanned with an electron beam emitted from the SEM emission element. At step 420, secondary electron emissions emitted as a result of the scanning of the electron beam are detected. At step 430, an intermediate signal reading is evaluated and an electron beam width is determined. At step 440 it is determined whether or not an adequate number of beam width measurements have been obtained. If an adequate number of beam measurements have not been obtained (NO), the process moves to step 445 and the SEM emission element is moved to a feature of a different orientation. The process then repeats step 410–430 for the feature having a different orientation. Returning to step 440, if an adequate number of measurements has been obtained (YES), the process advances to step 450 where the shape of the electron beam is determined. The process moves to step 460 and utilizes the shape of the beam to adjust the SEM beam roundness and SEM resolution accordingly.

FIG. 7 illustrates an alternate exemplary methodology for carrying out the present invention. The process begins at step 500 in which a substrate, such as a wafer, with re-entrant profile features is positioned in a CD-SEM system for performing measurements and a SEM emission element is moved to a first feature thereof in accordance with the present invention. In addition, parameters are initialized and flag conditions are set to their starting values. The process then proceeds to step 510.

At step 510, the feature is scanned with an electron beam emitted from the SEM emission element. At step 520, secondary electron emissions emitted as a result of the scanning of the electron beam are detected. At step 530, an intermediate signal reading is evaluated and an electron beam width is determined. At step 540 it is determined whether or not an adequate number of beam width measurements have been obtained. If an adequate number of beam measurements have not been obtained (NO), the process moves to step 545 and the SEM emission element is rotated a predetermined angular amount for a second beam width measurement reading. The process then repeats step 510–530 and scans the feature with the rotated beam emission element. Returning to step 540, if an adequate number of measurements has been obtained (YES), the process advances to step 550 where the shape of the electron beam is determined. The process moves to step 560 and utilizes the shape of the beam to adjust the SEM beam roundness and SEM resolution accordingly.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i. e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for determining the resolution of a measurement system employing an electron beam and a detector for detecting secondary emissions and generating a signal corresponding to the secondary emissions, the method comprising the steps of:

providing a wafer with at least one re-entrant feature and an open region adjacent the at least one re-entrant feature;

performing a scan of the at least one re-entrant feature with the electron beam to provide a signal corresponding to an image of the re-entrant feature, the signal having a first state corresponding to secondary electron emissions when the electron beam exclusively scans the open region, an intermediary state corresponding to secondary electron emissions when the electron beam partially scans the open region and partially scans the at least one re-entrant feature and a second state corresponding to secondary electron emissions when the electron beam exclusively scans the at least one re-entrant feature;

evaluating the intermediary state of the signal; and determining a first width of the electron beam based on the evaluation.

2. The method of claim 1, further including the step of moving the electron beam to a second re-entrant feature adjacent a second open region and having a different orientation than the at least one re-entrant feature, performing a scan of the second re-entrant feature to provide a second signal corresponding to an image of the second re-entrant feature, the second signal having a first state corresponding to secondary electron emissions when the electron beam exclusively scans the second open region, an intermediary state corresponding to secondary electron emissions when the electron beam partially scans the second open region and partially scans the second re-entrant feature and a second state corresponding to secondary electron emissions when the electron beam exclusively scans the second re-entrant feature, evaluating the intermediary state of the second signal and determining a second width of the electron beam based on the evaluation.

3. The method of claim 2, further including the step of determining a shape of the electron beam width based on the first and second widths.

4. The method of claim 2, further including the step of determining a resolution of the electron beam width based on the first and second widths.

5. The method of claim 4, further including the step of adjusting the roundness of the beam based on the first and second widths.

6. The method of claim 1, further including the step of rotating the electron beam a predetermined angular amount and performing a second scan of the at least one re-entrant feature to provide a second signal corresponding to a second image of the at least one re-entrant feature, the second signal having a first state corresponding to secondary electron emissions when the electron beam exclusively scans the open region, an intermediary state corresponding to secondary electron emissions when the electron beam partially scans the open region and partially scans the at least one re-entrant feature and a second state corresponding to secondary electron emissions when the electron beam exclusively scans the at least one re-entrant feature, evaluating the intermediary state of the second signal and determining a second width of the electron beam based on the evaluation.

7. The method of claim 6, further including the step of determining a shape of the electron beam based on the first and second widths.

8. The method of claim 6, further including the step of determining a resolution of the electron beam based on the first and second widths.

9. The method of claim 6, further including the step of adjusting the roundness of the electron beam based on the first and second widths.

10. The method of claim 1, wherein performing a scan of the at least one re-entrant feature with the electron beam comprises performing the scan using an electron beam having an energy of 500 ev to 40 kev.

11. A method for determining a shape of an electron beam in a scanning electron microscope system, the method comprising the steps of:
scanning a first re-entrant feature and an adjacent open region to produce a first signal having an intermediate portion corresponding to secondary electron emissions when the electron beam partially scans the open region and partially scans the first re-entrant feature;
scanning a second re-entrant feature and an adjacent second open region to produce a second signal having a second intermediate portion corresponding to secondary electron emissions when the electron beam partially scans the second open region and partially scans the second re-entrant feature, the second re-entrant feature having a different orientation than the first re-entrant feature; and
determining a shape of the electron beam based on an evaluation of the first and second signals.

12. The method of claim 11, further including scanning a plurality of features having different orientations with respect to one another to produce a plurality of signals.

13. The method of claim 12, wherein the step of determining the shape of the electron beam comprises evaluating an intermediate portion of each produced signal of the plurality of signals to determine an electron beam width corresponding to each scan.

14. A method for determining a shape of an electron beam in a scanning electron microscope system, the method comprising the steps of:
scanning a first re-entrant feature and an adjacent first open region to produce a first signal having an intermediate portion corresponding to secondary electron emissions when the electron beam partially scans the first open region and partially scans the first re-entrant feature;
rotating the electron beam an angular amount;
scanning the first re-entrant feature and the adjacent first open region to produce a second signal having an intermediate portion corresponding to secondary electron emissions when the electron beam partially scans the first open region and partially scans the first re-entrant feature; and
determining the shape of the electron beam based on evaluation of the first and second signals.

15. The method of claim 14, further including rotating the electron beam a plurality of times and repeating the step of scanning to produce a plurality of signals.

16. The method of claim 14, the step of determining the shape of the electron beam comprising evaluating an intermediate portion of each produced signal of the plurality of signals to determine an electron beam width corresponding to each scan.

17. A system for determining the resolution of a critical dimension system, comprising:
a measurement system configured for emitting a scanning signal along a substrate having at least one re-entrant feature;
wherein the measurement system is configured to produce a first signal based on a first image of the at least one re-entrant feature and an adjacent open region, wherein the first image is based on the scanning signal being directed at the at least one re-entrant feature and the open region and wherein the measurement system is further configured to determine a width of the scanning signal based on an intermediate portion of the first signal corresponding to secondary electron emissions when the scanning signal partially scans the open region and partially scans the at least one reentrant feature.

18. The system of claim 17, wherein the measurement system is scanning electron microscope.

19. The system of claim 17, wherein the portion of the first signal is an intermediary state portion.

20. The system of claim 17, wherein the scanning signal is an electron beam.

21. A system for determining the resolution of a critical dimension system, comprising:
an emitter for directing an electron beam onto a substrate having at least one re-entrant feature and an adjacent open region;
a movement system adapted to move the electron beam across the at least one re-entrant feature and the open region;
a detector for detecting interactions between the beam and the substrate and providing a detector signal indicative of the at least one re-entrant feature and having an intermediate portion corresponding to secondary electron emissions when the electron beam partially scans the open region and partially scans the at least one re-entrant feature; and
a controller for determining a beam width of the electron beam based on the detector signal.

22. The system of claim 21, the controller being adapted to determine the resolution of the critical dimension system based on the beam width.

23. The system of claim 21, the movement system being adapted to move the electron beam across a second re-entrant feature and an adjacent second open region, the second re-entrant feature having a different orientation than the at least one re-entrant feature, the detector being adapted to provide a detector signal indicative of the second re-entrant feature and having an intermediate portion corresponding to secondary electron emissions when the electron beam partially scans the second open region and partially scans the second re-entrant feature and the controller being adapted to determine a beam shape based on the detector signals.

24. The system of claim 23, the controller being adapted to adjust the resolution of the critical dimension system based on the beam shape.

25. The system of claim 23, the controller being adapted to adjust the roundness of the beam of the critical dimension system based on the beam shape.

26. The system of claim 21, the movement system being adapted to rotate the electron beam a predetermined angular amount and perform a second scan across the re-entrant feature, the detector being adapted to provide a detector signal indicative of the second scan and the controller being adapted to determine a beam shape based on the detector signals.

27. The system of claim 26, the controller being adapted to adjust the resolution of the critical dimension system based on the beam shape.

28. The system of claim 26, the controller being adapted to adjust the roundness of the beam of the critical dimension system based on the beam shape.

29. A system for determining the width of an electron beam, comprising:

means for directing an electron beam signal across a surface of a wafer having at least one re-entrant profile and an adjacent open region;

means for measuring a secondary signal generated as a result of the electron beam signal;

means for generating an image signal based on the secondary signal, wherein the image signal comprises a first state corresponding to secondary electron emissions when the electron beam exclusively scans the open region, an intermediary state corresponding to secondary electron emissions when the electron beam partially scans the open region and partially scans the at least one re-entrant profile and a second state corresponding to secondary electron emissions when the electron beam exclusively scans the at least one re-entrant profile; and means for determining a width of the electron beam based on the image signal.

* * * * *